(12) United States Patent
Mokhlesi

(10) Patent No.: US 8,248,859 B2
(45) Date of Patent: Aug. 21, 2012

(54) METHODS OF FORMING AND OPERATING NAND MEMORY WITH SIDE-TUNNELING

(75) Inventor: Nima Mokhlesi, Los Gatos, CA (US)

(73) Assignee: Sandisk Corporation, Milpitas, CA (US)

( * ) Notice: Subject to any disclaimer, the term of this patent is extended or adjusted under 35 U.S.C. 154(b) by 211 days.

(21) Appl. No.: 12/782,957

(22) Filed: May 19, 2010

(65) Prior Publication Data

US 2010/0226182 A1 Sep. 9, 2010

Related U.S. Application Data

(62) Division of application No. 11/693,765, filed on Mar. 30, 2007, now Pat. No. 7,745,285.

(51) Int. Cl.
*G11C 16/04* (2006.01)
(52) U.S. Cl. .............................. 365/185.28; 365/185.17
(58) Field of Classification Search .............. 365/185.28
See application file for complete search history.

(56) References Cited

U.S. PATENT DOCUMENTS

| | | |
|---|---|---|
| 5,043,940 A | 8/1991 | Harari |
| 5,053,839 A | 10/1991 | Esquivel et al. |
| 5,070,032 A | 12/1991 | Yuan et al. |
| 5,095,344 A | 3/1992 | Harari |
| 5,168,465 A | 12/1992 | Harari |
| 5,172,338 A | 12/1992 | Mehrotra et al. |
| 5,198,380 A | 3/1993 | Harari |
| 5,268,318 A | 12/1993 | Harari |
| 5,268,319 A | 12/1993 | Harari |
| 5,279,982 A | 1/1994 | Crotti |
| 5,297,148 A | 3/1994 | Harari et al. |
| 5,313,421 A | 5/1994 | Guterman et al. |
| 5,315,541 A | 5/1994 | Harari et al. |
| 5,343,063 A | 8/1994 | Yuan et al. |
| 5,380,672 A | 1/1995 | Yuan et al. |
| 5,471,423 A | 11/1995 | Iwasa |
| 5,512,505 A | 4/1996 | Yuan et al. |
| 5,534,456 A | 7/1996 | Yuan et al. |
| 5,554,553 A | 9/1996 | Harari |
| 5,579,259 A | 11/1996 | Samachisa et al. |
| 5,595,924 A | 1/1997 | Yuan et al. |
| 5,604,032 A | 2/1997 | Kai et al. |
| 5,621,233 A | 4/1997 | Sharma |
| 5,637,897 A | 6/1997 | Oyama |

(Continued)

FOREIGN PATENT DOCUMENTS

EP 0780902 6/1997
(Continued)

OTHER PUBLICATIONS

Application and File History for U.S. Appl. No. 11/693,765, filed Mar. 30, 2007, inventor Mokhlesi.

(Continued)

*Primary Examiner* — Thien F Tran
(74) *Attorney, Agent, or Firm* — Patterson Thuente Skaar Christensen, P.A.

(57) ABSTRACT

A string of nonvolatile memory cells are formed with control gates extending between floating gates, control gates and floating gates separated by tunnel dielectric layers. Electron tunneling between control gates and floating gates is used for programming. A process for forming a memory array forms odd numbered floating gates from a first layer and even numbered floating gates from a second layer.

5 Claims, 5 Drawing Sheets

U.S. PATENT DOCUMENTS

| | | | |
|---|---|---|---|
| 5,640,032 | A | 6/1997 | Tomioka |
| 5,654,217 | A | 8/1997 | Yuan et al. |
| 5,661,053 | A | 8/1997 | Yuan |
| 5,665,987 | A | 9/1997 | Muraoka |
| 5,677,872 | A | 10/1997 | Samachisa et al. |
| 5,680,345 | A | 10/1997 | Hsu et al. |
| 5,688,705 | A | 11/1997 | Bergemont |
| 5,712,179 | A | 1/1998 | Yuan |
| 5,712,180 | A | 1/1998 | Guterman et al. |
| 5,747,359 | A | 5/1998 | Yuan et al. |
| 5,751,038 | A | 5/1998 | Mukherjee |
| 5,756,385 | A | 5/1998 | Yuan et al. |
| 5,786,988 | A | 7/1998 | Harari |
| 5,847,425 | A | 12/1998 | Yuan et al. |
| 5,851,881 | A | 12/1998 | Lin et al. |
| 5,867,429 | A | 2/1999 | Chen et al. |
| 5,883,409 | A | 3/1999 | Guterman et al. |
| 5,923,976 | A | 7/1999 | Kim |
| 5,943,572 | A | 8/1999 | Krautschneider |
| 5,962,889 | A | 10/1999 | Yamauchi et al. |
| 5,965,913 | A | 10/1999 | Yuan et al. |
| 5,981,335 | A | 11/1999 | Chi |
| 5,999,448 | A | 12/1999 | Kurihara et al. |
| 6,028,336 | A | 2/2000 | Yuan |
| 6,046,935 | A | 4/2000 | Takeuchi et al. |
| 6,048,768 | A | 4/2000 | Ding et al. |
| 6,057,580 | A | 5/2000 | Watanabe et al. |
| 6,069,382 | A | 5/2000 | Rahim |
| 6,072,721 | A | 6/2000 | Arase |
| 6,103,573 | A | 8/2000 | Harari et al. |
| 6,151,248 | A | 11/2000 | Harari et al. |
| 6,159,801 | A | 12/2000 | Hsieh et al. |
| 6,180,457 | B1 | 1/2001 | Shin et al. |
| 6,208,545 | B1 | 3/2001 | Leedy |
| 6,222,762 | B1 | 4/2001 | Guterman et al. |
| 6,235,586 | B1 | 5/2001 | Au et al. |
| 6,256,225 | B1 | 7/2001 | Noble et al. |
| 6,258,665 | B1 | 7/2001 | Shimizu et al. |
| 6,281,075 | B1 | 8/2001 | Yuan et al. |
| 6,295,227 | B1 | 9/2001 | Sakui et al. |
| 6,297,097 | B1 | 10/2001 | Jeong et al. |
| 6,340,611 | B1 | 1/2002 | Shimizu et al. |
| 6,391,717 | B1 | 5/2002 | Shin et al. |
| 6,406,961 | B1 | 6/2002 | Chen |
| 6,417,538 | B1 | 7/2002 | Choi |
| 6,426,529 | B2 | 7/2002 | Kobay |
| 6,429,072 | B1 | 8/2002 | Tsukiji |
| 6,509,222 | B1 | 1/2003 | Grossi et al. |
| 6,512,263 | B1 | 1/2003 | Yuan et al. |
| 6,518,618 | B1 | 2/2003 | Fazio et al. |
| 6,522,580 | B2 | 2/2003 | Chen et al. |
| 6,529,410 | B1 | 3/2003 | Han et al. |
| 6,559,009 | B2 | 5/2003 | Jeng |
| 6,614,684 | B1 | 9/2003 | Shukuri et al. |
| 6,624,464 | B2 | 9/2003 | Shin et al. |
| 6,720,610 | B2 | 4/2004 | Iguchi et al. |
| 6,738,289 | B2 | 5/2004 | Gongwer et al. |
| 6,762,092 | B2 | 7/2004 | Yuan et al. |
| 6,768,161 | B2 | 7/2004 | Kinoshita |
| 6,770,932 | B2 | 8/2004 | Himeno et al. |
| 6,806,132 | B2 | 10/2004 | Mori et al. |
| 6,807,095 | B2 | 10/2004 | Chen et al. |
| 6,888,755 | B2 | 5/2005 | Harari |
| 6,894,930 | B2 | 5/2005 | Chien et al. |
| 6,898,121 | B2 | 5/2005 | Chien et al. |
| 6,953,970 | B2 | 10/2005 | Yuan et al. |
| 6,974,746 | B2 | 12/2005 | Iguchi et al. |
| 6,987,047 | B2 | 1/2006 | Iguchi et al. |
| 7,026,684 | B2 | 4/2006 | Sakuma et al. |
| 7,078,763 | B2 | 7/2006 | Arai et al. |
| 7,170,786 | B2 | 1/2007 | Chien et al. |
| 7,211,866 | B2 | 5/2007 | Yuan et al |
| 7,355,237 | B2 | 4/2008 | Lutze et al. |
| 7,385,015 | B2 | 6/2008 | Holtcamp |
| 7,582,928 | B2 | 9/2009 | Iguchi et al. |
| 2001/0001491 | A1 | 5/2001 | Sakui |
| 2002/0093073 | A1 | 7/2002 | Mori et al. |
| 2005/0157549 | A1 | 7/2005 | Mokhlesi et al. |
| 2005/0190600 | A1* | 9/2005 | Arai et al. ............ 365/185.14 |
| 2005/0199939 | A1 | 9/2005 | Lutze et al. |
| 2007/0161191 | A1 | 7/2007 | Yuan et al. |
| 2007/0166919 | A1 | 7/2007 | Iguchi et al. |
| 2007/0198766 | A1 | 8/2007 | Mizukami et al. |
| 2008/0076217 | A1 | 3/2008 | Chien et al. |
| 2008/0079059 | A1 | 4/2008 | Wu |

FOREIGN PATENT DOCUMENTS

| | | |
|---|---|---|
| EP | 1104023 | 5/2001 |
| JP | 11-026731 | 1/1999 |
| JP | 11-054732 | 2/1999 |
| JP | 11-186419 | 7/1999 |
| JP | 2000-236031 | 8/2000 |
| JP | 2001/024076 | 1/2001 |
| KR | 2001-0062298 | 7/2001 |
| KR | 2002/0088554 | 11/2002 |
| WO | WO 99/44239 | 9/1999 |
| WO | WO 01/41199 | 6/2001 |
| WO | WO 04/001852 | 12/2003 |

OTHER PUBLICATIONS

Application and File History for U.S. Appl. No. 12/363,165, filed Jan. 30, 2009, inventor Chien.

Application and File History for U.S. Appl. No. 11/689,775, filed Mar. 22, 2007, inventor Yuan.

Application and File History for U.S. Appl. No. 11/693,769, filed Mar. 2007, inventor Mokhlesi.

Application and File History for U.S. Appl. No. 09/925,102, filed Aug. 8, 2001, inventor Yuan.

Application and File History for U.S. Appl. No. 10/799,180, filed Mar. 12, 2004, inventor Yuan.

Application and File History for U.S. Appl. No. 11/111,129, filed Apr. 20, 2005, inventor Yuan.

Application and File History for U.S. Appl. No. 10/175,764, filed Jun. 19, 2002, inventor Chien.

Application and File History for U.S. Appl. No. 10/353,570, filed Jan. 28, 2003, inventor Chien.

Application and File History for U.S. Appl. No. 11/086,648, filed Mar. 2005, inventor Chien.

Office Action in related PRC (China) Patent Application No. 02815618.8 mailed Jun. 5, 2009.

Office Action in related Korean Application No. 2004-7002026 Action mailed Nov. 3, 2008.

Office Action in related Korean Application No. 2004-7020775 Action mailed Sep. 30, 2009.

Aritome et al, "A Novel Side-Wall Transfer-Transistor Cell (SWATT Cell) for Multi-Level NAND EEPROMs", 1995 IEEE International Solid-State Circuits Conference, IEDM 95, pp. 275-278.

Aritome et al., "A 0.67 um2 Self-Aligned Shallow Trench Isolation Cell (SA-STI Cell) for 3V-only 256 Mbit NAND EEPROMs", IEDM Technical digest, pp. 61-64 (1994).

Chan et al., A True-Single-Transistor Oxide-Nitide-Oxide EEPROM Device, IEEE Electron Device Letters, vol. EDL-8, No. 3, Mar. 1987, pp. 93-95.

Cho et al., A Dual-Mode NAND Flash Memory: 1Gb Multilevel and High-Performance 512-Mb Single-Level Modes, IEEE Journal of Solid-State Circuits, vol. 36, No. 11, pp. 1700-1706 (2001).

Office Action in related PRC (China) Patent Application No. 03813980.4 mailed Oct. 13, 2006.

DiMaria et al., Electrically-alterable read-only-memory using Si-rich SIO.

Aritome, "Advanced Flash Memory Technology and Trends for File Storage Application,"IEDM Technical Digest, International Electronic Devices Meeting, IEEE, San Francisco, California, Dec. 10-13, 2000, pp. 33.1.1-33.1.4.

Eitan et al., "NROM: A Novel Localized Trapping, 2-Bit Nonvolatile Memory Cell," IEEE Electron Device Letters, vol. 21, No. 11, Nov. 2000, pp. 543-545.

Takeuchi, Y., et al., "A Self-Aligned STI Process Integration for Low Cost and Highly Reliable 1 Gbit Flash Memories," 1998 Symposium on VLSI Technology; Digest of Technical Papers, IEEE, Honolulu, Hawaii, Jun. 9-11, 1998, pp. 102-103.

EPOIISA, "International Search Report", mailed in PCT/US02/25025 on Apr. 4, 2003, 4 pages.

Nozaki et al., "A 1-Mb EEPROM with MONOS Memory Cell for Semiconductor Disk Application," IEEE Journal o/Solid State Circuits, vol. 26, No. 4, Apr. 1991, pp. 497-501.

Hori et al., "A MOSFET with Si-implanted Gate-Sin, Insulator for Nonvolatile Memory Applications," IEDM 92, Apr. 1992, pp. 469-472.

Office Action for corresponding PRC Patent Application No. 02815618.8, mailed May 16, 2006, 9 pages.

Lee, Jae-Duk, et al., "Effects of Parasitic Capacitance on NAND Flash Memory Cell Operation," NonVolatile Semiconductor Memory Workshop, IEEE, Monterey, California, Aug. 12-16, 2001, pp. 90-92.

EP Office Action dated Jun. 21, 2010 for Application No. 03736962.6.

EP Office Action dated Jan. 14, 2011 for Application No. 03736962.6.

* cited by examiner

METHODS OF FORMING AND OPERATING NAND MEMORY WITH SIDE-TUNNELING

RELATED APPLICATION

This Application is a divisional of application Ser. No. 11/693,765, filed Mar. 30, 2007, and is related to application Ser. No. 11/693,769, filed Mar. 30, 2007, now U.S. Pat. No. 7,512,005, entitled NAND MEMORY WITH SIDE-TUNNELING, which are incorporated by reference herein in their entireties.

BACKGROUND OF THE INVENTION

This invention relates to nonvolatile memories with floating gates and methods of forming and operating nonvolatile memories with floating gates.

Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above.

Different types of memory array architecture are used in nonvolatile memory systems. In one type of architecture, a NAND array, a series of strings of more than two memory cells, such as 16 or 32, are connected along with one or more select transistors between individual bit lines and a reference potential to form columns of cells. Word lines extend across cells within a large number of these columns. An individual cell within a column is read and verified during programming by causing the remaining cells in the string to be over driven so that the current flowing through a string is dependent upon the level of charge stored in the addressed cell.

SUMMARY OF THE INVENTION

A method of programming a NAND flash memory array according to an embodiment comprises applying a first voltage to a first control gate adjacent to a floating gate on a first side; applying a second voltage to a second control gate adjacent to the floating gate on a second side; applying a third voltage to a channel region under the floating gate, wherein the first voltage, the second voltage and the third voltage couple to the floating gate to generate a voltage difference between the first control gate and the floating gate that is sufficient to produce electron tunneling between the first control gate and the floating gate.

A NAND flash memory array according to an embodiment comprises a floating gate having a first control gate on a first side and a second control gate on an opposing second side, the first and second control gates separated from the floating gate by a tunnel dielectric, the floating gate separated from an underlying substrate by a gate dielectric layer, the gate dielectric layer including a blocking layer.

A method of forming a NAND flash memory array according to an embodiment comprises: forming a first gate dielectric layer that includes a blocking layer to block electron tunneling through the first gate dielectric layer; forming a first floating gate layer over the first floating gate layer; patterning the first gate dielectric layer and the first floating gate layer in the same pattern to leave first floating gate portions and openings between first floating gate portions; forming a second gate dielectric layer within the openings, the second gate dielectric layer including a blocking layer to block electron tunneling through the second gate dielectric layer; forming a second floating gate portions over the second gate dielectric layer within the openings; etching the first and second floating gate portions so that first and second floating gate portions have an inverted-T shape in cross section; and forming control gates that extend between neighboring floating gate portions.

A NAND flash memory array according to an embodiment comprises: a floating gate having a first control gate on a first side and a second control gate on an opposing second side, the first and second control gates separated from the floating gate by a tunnel dielectric, the floating gate separated from an underlying substrate by a gate dielectric layer, the gate dielectric layer including a blocking layer that blocks tunneling of electrons between the substrate and the floating gate.

A NAND string according to an embodiment comprises: a plurality of floating gate memory cells connected in series in a first direction, each of the plurality of floating gate memory cells having a floating gate, odd numbered ones of the plurality of floating gates formed from a first layer, even numbered ones of the plurality of floating gates formed from a second layer; a plurality of control gates that extend in a second direction that is perpendicular to the first direction, each of the plurality of control gates coupled to two of the plurality of floating gates; a tunnel dielectric layer that separates one of the plurality of control gates from one of the plurality of floating gates to allow electron tunneling; and a blocking dielectric layer between the plurality of floating gates and an underlying substrate, the blocking layer blocking electron tunneling.

A method of forming a NAND flash memory array according to an embodiment comprises: forming a first plurality of floating gates of a NAND string from a first conductive layer that is formed over a substrate; and forming a second plurality of floating gates of the NAND string from a second conductive layer that is formed over the substrate.

DETAILED DESCRIPTION OF ILLUSTRATED EMBODIMENTS

Figure 1:
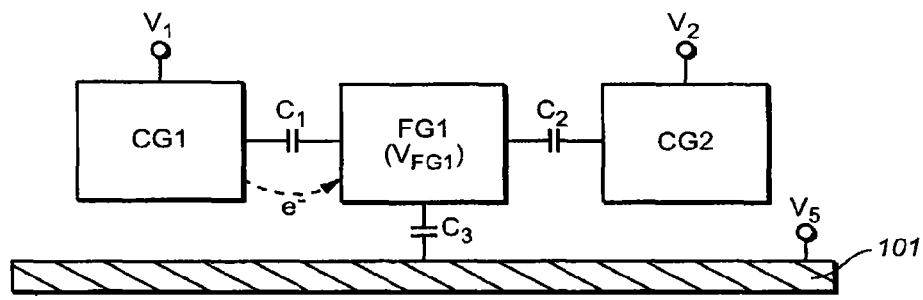
FIG. 1 shows a cross section of a portion of a NAND string using side-tunneling to modify the charge stored in a floating gate.

FIG. 1 shows a cross section of a portion of a NAND flash memory string that has control gates extending between floating gates (sometimes referred to as ENAND). The cross section shown is along the bit line direction (also the direction in which cells are connected in series to form NAND strings) and control gates extend in the direction perpendicular to the cross section shown. Examples of such strings and methods of forming them are described in U.S. Pat. No. 6,888,755. In the string of FIG. 1 a floating gate FG1 is coupled to two control gates CG1 and CG2, one on either side of floating gate FG1. This is in contrast to a common memory design where a control gate overlies a floating gate so that each floating gate is coupled to only one control gate. A memory string such as that shown in part in FIG. 1 may be formed as part of a memory array having many strings. Neighboring strings may be isolated from each other by Shallow Trench Isolation (STI) structures (not shown in FIG. 1), or other means. In some cases, individual stings may have 8, 16, 32 or more memory cells connected together in series. Select gates are provided at either end of the string to allow the string to be connected to circuits used for accessing the memory cells.

Applying appropriate voltages V1, V2 to control gates CG1, CG2 and underlying channel 101 allows programming, erasing and reading of memory cells. In general, floating gate memory cells are considered to be programmed when they contain amounts of charge that reflect programmed data. Cells are programmed to their individual programmed states from a common erased state. Cells are generally erased together in blocks so that all cells in a block are brought to the erased state together. Typically, the floating gate of a cell in the erased state contains little or no charge and is programmed by adding charge up to a desired amount that corresponds to a desired logical state. Alternatively, the floating gate of a cell in the erased state may contain a predetermined amount of charge and such a cell is programmed by removing charge until the amount of charge in the floating gate reaches the desired amount that corresponds to a desired logical state. Thus, erasing may involve either adding or removing charge to bring cells of a block to a common state. Programming may involve either adding or removing charge from cells to bring cells to states that reflect programmed data.

In many floating gate memory cells, charge is added to the floating gate from the underlying substrate and is removed from the floating gate to the underlying substrate for erase and programming. However, in other designs, electrons may tunnel from a control gate to a floating gate. Examples of such programming are described in US Patent Application Publication No. 20050157549. In contrast, FIG. 1 shows a NAND string in which charge is added to a floating gate from a control gate that extends on one side of the floating gate. Charge may also be removed from the floating gate to a control gate on one side. Addition and removal of charge in this way, from the side, may be by Fowler-Nordheim (FN) tunneling and may be considered side-tunneling. Where electron tunneling is the primary mechanism for transfer of charge to and from a floating gate, the dielectric though which electron tunneling occurs may be considered to be a tunnel dielectric (also referred to as tunnel oxide where Silicon dioxide or other oxide is used as the dielectric material). Whereas many floating gate memory cells have tunnel dielectric between a floating gate and the underlying substrate, FIG. 1 has tunnel dielectric between the floating gate and a control gate on at least one side to facilitate side-tunneling. By applying appropriate voltages to control gates on either side (and to the underlying channel region in the substrate), tunneling of electrons between control gate CG1 and the floating gate may be produced.

In general, a relatively high voltage (compared with voltages used in reading for example) is applied across a tunnel dielectric in order to produce side-tunneling. The structure of FIG. 1 allows a relatively high voltage difference to be developed between a control gate CG1 and a floating gate FG1 by using the second control gate CG2 and the underlying channel region to maintain the voltage of the floating gate. To produce tunneling of electrons from control gate CG1 to floating gate FG1, voltage V1 on control gate CG1 may be maintained at a low voltage (e.g. 0 volts) while voltage V2 applied to control gate CG2 is high (approximately 20 volts) and the voltage $V_S$ applied to the channel region is high (approximately 20 volts). In this example, parasitic capacitances are approximately 10% of the total floating gate capacitance of floating gate FG1 with control gates CG1, CG2 and the channel each providing 30% of the total (i.e. capacitances C1, C2 and C3 are approximately equal). In other examples, these percentages may be different. The combination of high voltage on both second control gate CG2 and the channel results in a relatively high voltage on floating gate FG1 (approximately 13 volts, ignoring the effect of charge on floating gate FG1). Thus a relatively high voltage difference of 13 volts is produced between control gate CG1 and floating gate FG1. In this example, 13 volts is sufficient to provide electron tunneling from CG1 to FG1, thus programming floating gate FG1. However, the voltage difference between floating gate FG1 and control gate CG2 is 7 volts, which is not sufficient for significant electron tunneling to occur, so charge enters floating gate FG1 but does not leave so that the charge level (and thus the threshold voltage of the device) changes. In this way, by placing opposing voltages on control gates on either side of the floating gate in addition to coupling from the channel region, tunneling may be produced between one control gate and a floating gate.

One method of programming a floating gate memory cell is to provide a series of pulses of programming voltage with verification of cell program state between pulses. A floating gate that has reached a desired level of charge may be inhibited from further change in charge level while other floating gates along the same row continue to be programmed. One way to inhibit programming of a cell is by modifying the voltage applied to the underlying channel region. Thus, when FG1 reaches a desired level of charge (as verified by a verification step), voltage V.sub.S may be reduced to a lower voltage, e.g. 10 volts. This results in a voltage V.sub.FG1 on floating gate FG1 of approximately 10 volts. Thus, there is a 10 volt voltage difference between control gate CG1 and floating gate FG1, which is insufficient to cause electron tunneling. There is also a 10 volt voltage difference between control gate CG2 and floating gate FG1, which is insufficient to cause electron tunneling. So programming of floating gate FG1 ceases, while programming of other floating gates in the same row (between control gates CG1 and CG2) continues.

Erasing a memory cell such as that shown in FIG. 1 may be performed by causing electron tunneling in the opposite direction to that used for programming, in this case electrons are removed from floating gate FG1 to control gate CG1. This may be achieved by causing a relatively large voltage difference between floating gate FG1 and control gate CG1, while providing smaller voltage differences between floating gate FG1 and control gate CG2, and between floating gate FG1 and channel 101. For example, where voltage V1 applied to control gate CG1 is 20 volts, voltage V2 applied to CG2 is 0 volts and voltage V.sub.S applied to channel 101 is 0 volts, voltage V.sub.FG1 on floating gate FG1 will be approximately 7 volts. This results in a voltage difference of 13 volts between floating gate FG1 and control gate CG1, which is sufficient to cause electron tunneling (with electrons going from floating gate FG1 to control gate CG1). The voltage difference between control gate CG2 and floating gate FG1 in this case is only 7 volts, which is not sufficient to cause electron tunneling. Thus, electrons tunnel from floating gate FG1 to control gate CG1 and negative charge is removed from floating gate FG1.

Both programming and erasing may be done from one control gate so that a tunnel oxide may only be needed on one side of a floating gate in some cases. A different dielectric layer may be used on the other side of such a floating gate. The structure of FIG. 1 is symmetric, with a tunnel dielectric layers on both sides of floating gate FG1 so that programming can be carried out from either side. High voltages used in programming and erasing may cause tunnel dielectrics to deteriorate, providing a mechanism for wear and even failure. By reversing the voltages given in the examples above, electron tunneling between control gate CG2 and floating gate FG1 may be produced. This may be used to reduce wear on a particular tunnel dielectric by alternating between sides, switching from one side to the other periodically, or at a certain point in the device life, or some other scheme that involves electron tunneling from different sides at different times. By spreading the stress of programming and erasing between two dielectric layers, the wear may be reduced to approximately half the level that would occur if programming and erasing were only from one side. Also, if tunnel oxide of FIG. 1 undergoes significant wear and it becomes damaged, because the tunnel oxide does not directly overlie the channel, the effects of such damage on device performance are generally no worse than they are in the case where the tunnel oxide directly overlies the channel.

During reading, both control gates may be used together to provide a high degree of coupling (in this example, the combined coupling by control gates CG1 and CG2 is 60% of the total). In one arrangement, the same series of stepped voltages are applied to control gates CG1 and CG2 simultaneously during a read operation with underlying channel 101 being connected to a sense circuit. Thus, control gates are used in opposition during programming and are used together during reading. In this way, a relatively low coupling ratio for an individual control gate facilitates electron tunneling during programming, and a relatively high coupling ratio for two control gates used in combination facilitates reading.

Figure 2:
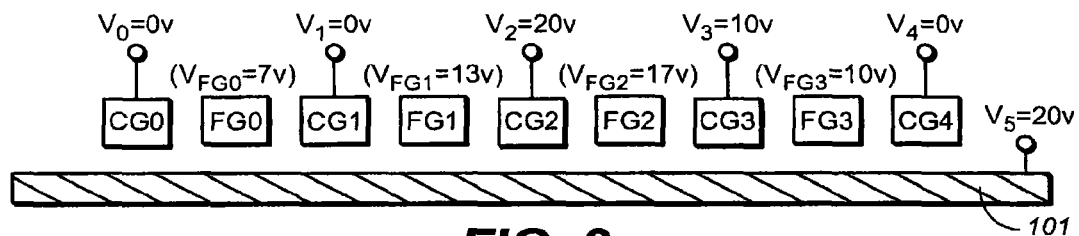
FIG. 2 shows an expanded view of the NAND string of FIG. 1 including voltages applied to control gates during programming of floating gate FG1.

FIG. 2 shows additional cells of the NAND string of FIG. 1 and exemplary voltages applied to them during programming. Voltages may be applied to control gates that are not immediately adjacent to floating gate FG1 that is being programmed or erased so that no tunneling occurs to or from other floating gates in the string. This ensures that no changes in charge levels occur in cells that have already been programmed, thus no disturbance of programmed data occurs. In particular, a voltage V0 of 0 volts is applied to a control gate CG0 on the left of FIG. 2 so that a voltage V.sub.FG0 of approximately 7 volts is produced in floating gate FG0. Thus, there is insufficient voltage difference (7 volts) between FG0 and control gates CG0 and CG1 on either side of floating gate FG0 to cause tunneling. An intermediate voltage V3 (between 0 and 20 volts) is applied to control gate CG3. In this case V3 is chosen to be 10 volts, resulting in a voltage V.sub.FG2 of approximately 17 volts on floating gate FG2. Thus, the voltage difference between control gate CG2 and floating gate FG2 is approximately 3 volts and the voltage difference between control gate CG3 and floating gate FG2 is approximately 7 volts, both of which are too small to cause electron tunneling. Thus, floating gate FG2 does not experience a change in charge level during programming of floating gate FG1. A voltage V4 of 0 volts is applied to control gate CG4 so that floating gate FG3 has a voltage V.sub.FG3 of approximately 10 volts. The voltage difference of 10 volts between floating gate FG3 and control gate CG4 is not sufficient to cause electron tunneling so that the charge level of floating gate FG3 is not affected by programming of floating gate FG1. Any other control gates in the string may be at 0 volts also. In other schemes, other voltages are applied to control gates that are adjacent to unselected floating gates. Tunneling between floating gates and the substrate does not generally occur in on a significant scale in this configuration because of the material (or materials) and thickness of the dielectric layer separating the floating gates from the substrate.

Figure 3:
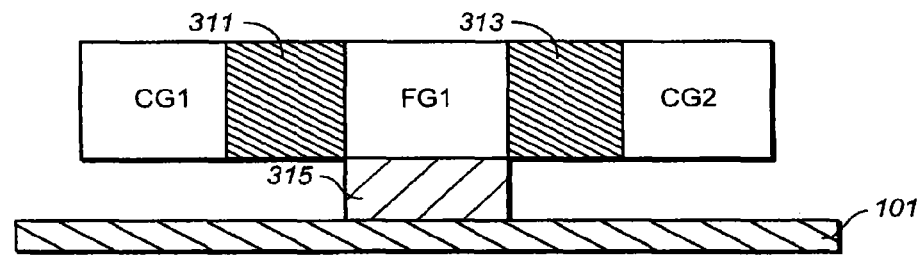
FIG. 3 shows additional components of the NAND string of FIG. 1 including dielectric portions between floating gate FG1 and control gates CG1 and CG2, also a dielectric portion between floating gate FG1 and the underlying substrate.

Certain dielectric layers are more suitable as tunnel dielectric layers. In order to facilitate tunneling of electrons between a control gate and a floating gate, a dielectric layer of suitable material and thickness is used. FIG. 3 shows a tunnel dielectric 311 between control gate CG1 and floating gate FG1 and a tunnel dielectric 313 between floating gate FG1 and control gate CG2 (though in other examples, a tunnel dielectric may only be provided on one side). Generally, tunnel dielectric 311 and tunnel dielectric 313 are of the same material or materials, and are formed together. Examples of suitable tunnel dielectrics include Silicon dioxide and Silicon Oxynitride. A tunnel dielectric may be grown or deposited, e.g. by Atomic Layer Deposition (ALD). Certain dielectrics used between floating gates and control gates in other devices may not make good tunnel dielectrics. For example, an Oxide-Nitride-Oxide (ONO) stack is generally unsuitable as a tunnel dielectric because charge may be trapped in such a layer and trapped charge may affect device characteristics. High-K dielectrics are generally not suitable for use as tunneling dielectrics because of charge trapping. A dielectric layer that does not favor electron tunneling may be referred to as a blocking layer. Thus, ONO layers and many high-K dielectric layers may be considered to be blocking layers.

Providing electron tunneling between a control gate and a floating gate may make electron tunneling between the substrate and the floating gate unnecessary (though both may be used together in some cases). Where electron tunneling between the channel and floating gate is not desired, the dielectric layer between the floating gate and channel does not have to be a tunnel dielectric, thus allowing a range of dielectric layers, including blocking layers, to be used at this location. In the present example, tunneling between channel 101 and floating gate FG1 is not desirable and so a blocking layer is used between channel 101 and floating gate FG1. In particular, FIG. 3 shows a dielectric layer 315 that includes a blocking material (in this case, comprising a high-K dielectric material) separating the floating gate from the underlying channel. Such high-K dielectrics allow a high degree of capacitive coupling between a channel and a floating gate with a dielectric thickness that is sufficient to prevent significant leakage of charge.

A high-K dielectric is any dielectric material that has a higher relative dielectric constant than Silicon dioxide (a relative dielectric constant higher than 3.9). In general, capacitance is given by the equation:

$$C = \frac{K\varepsilon_0 A}{t}$$

where K is the relative dielectric constant of the dielectric material, $\varepsilon_0$ is the permittivity of free space, A is the capacitor area and t is the thickness of the dielectric. High-K dielectrics allow a high capacitance (high coupling ratio) to be achieved for a given dielectric thickness. A high-K dielectric may be comprised of a single layer of material or may be comprised of two or more layers of different materials. Materials that may be used include Aluminum Oxide ($Al_2O_3$), Hafnium Oxide ($HfO_2$), Hafnium Silicate ($Hf_xSi_yO_z$), Hafnium Silicon Oxynitride (HfSiON), Aluminum Oxynitride (AlON), Hafnium Aluminum Oxide (HfAlO), Hafnium Aluminum Oxide (HfAlO), Hafnium Aluminum Oxynitride (HfAlON), Zirconium Oxide (ZrO) and other suitable materials.

One mechanism for degradation of memory cell performance in memory devices is trapping of charge in a dielectric. For example, where a NAND structure is programmed by electron tunneling from the substrate, there is a risk that electrons from the substrate may be trapped in an interlayer dielectric between a floating gate and a control gate. Where a tunnel oxide separates a floating gate from the underlying substrate, electrons tunnel from the substrate through the tunnel oxide during programming. However, some of these electrons, especially where they are close to control gates, may be drawn to the higher voltage of the control gate. These electrons may become trapped in the interlayer dielectric between the floating gate and the control gate causing degradation in device performance. One way to reduce such charge trapping is to use floating gates that are shaped to provide shielding between the control gates and the channel. An example of such floating gates is given in FIG. 4, which shows floating gates 420a-c having an inverted-T shape in cross section.

Figure 4:
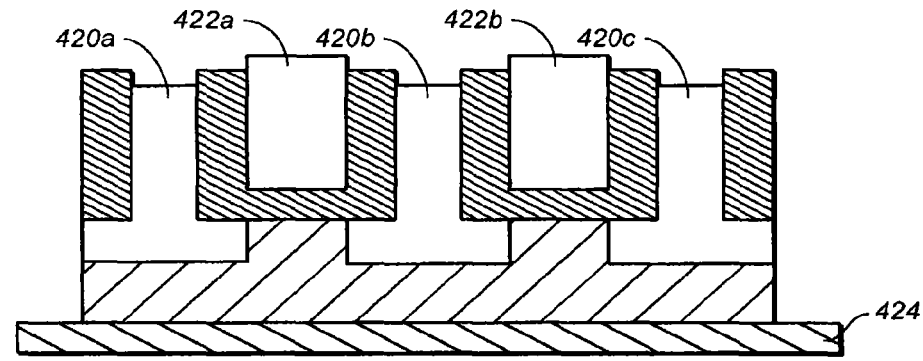
FIG. 4 shows a NAND string according to an alternative embodiment with floating gates having an inverted-T shape in cross section.

While the floating gates and control gates shown in FIGS. 1-3 are rectangular in shape different structures may also be used, including inverted-T shaped floating gates. FIG. 4 shows control gates 422a-b extending on either side of floating gate 420b. In addition to reducing electron trapping, the structure of FIG. 4 may allow better floating gate to channel coupling for a given device size because floating gates 420a-c are wider at the bottom to provide increased coupling area with channel 424 and narrower at the top so that the added area does not increase the overall device size. This design may also provide improved coupling between control gates and floating gates, and may reduce coupling between control gates and the underlying channel. In particular, where only small gaps are left between floating gates, control gates are generally shielded from the substrate and few electrons are drawn to the control gates and the dielectric around the control gates. Floating gate 420b in this example provides good shielding between neighboring control gates 422a-b so that coupling between control gate 422a and control gate 422b may be relatively low. Also, the cross sectional area of such inverted-T shaped floating gates may be reduced compared with a floating gate having a rectangular cross sectional shape (as shown by comparison of FIGS. 3 and 4) so that coupling between floating gates of neighboring strings in the word line direction is reduced. Examples of memory cells having inverted-T shaped floating gates are provided in US Patent Application Publication No. 20050199939 and in U.S. Pat. No. 7,026,684. In an embodiment of the present invention, a NAND memory array having inverted-T shaped floating gates uses side-tunneling for programming and erasing floating gate memory cells.

Various processes may be used to form various floating gate memory arrays according to aspects of the present invention. In one embodiment a self-aligned process is used to form a memory array in which floating gates are formed from two different conductive layers, with floating gates along a string being formed from alternate layers (i.e. odd numbered floating gates along a string are formed from one layer, even numbered floating gates along a string are formed from another layer). An exemplary process for forming such an array is shown in FIGS. 5-11. The process of FIGS. 5-11 provides a NAND array having floating gates with an inverted-T shape in cross section and having suitable dielectric layers to facilitate side-tunneling. Other processes may also be used to form a NAND array for side-tunneling with inverted-T or other floating gate shapes.

Figure 5:
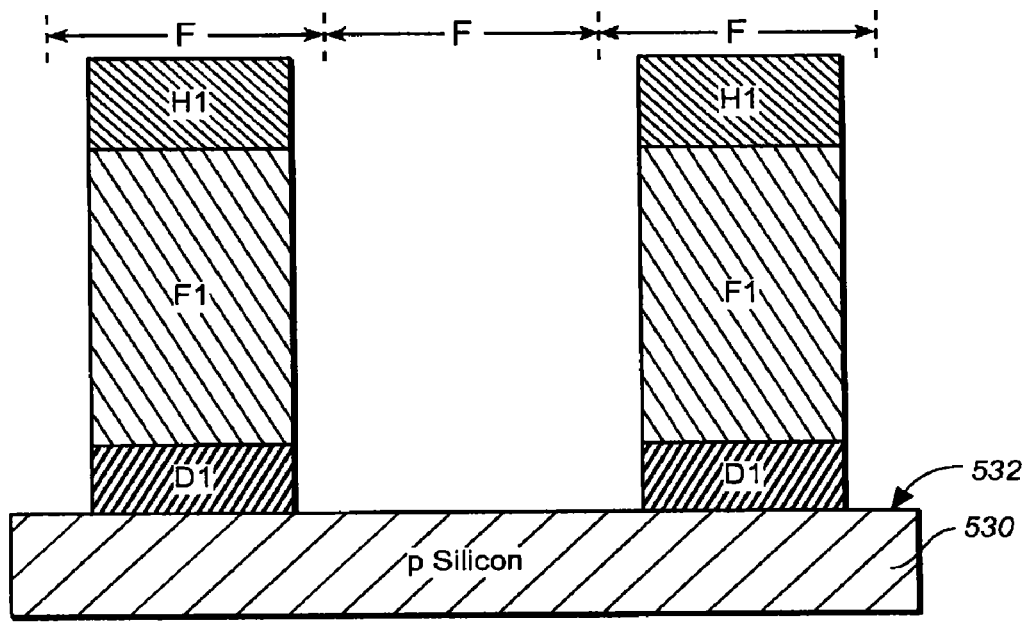
FIG. 5 shows a portion of a NAND string according to an embodiment of the present invention at an intermediate stage of fabrication having a first dielectric layer and a first floating gate layer patterned using a hard mask layer.

FIG. 5 shows a cross section of a portion of a NAND string at an intermediate stage of fabrication. A substrate 530 has a P-doped portion underlying a surface 532. A first dielectric layer D1 is formed over the substrate surface, then a floating gate layer F1 is deposited over dielectric layer D1 and a mask layer H1 is formed over floating gate layer F1. Dielectric layer D1 may be formed of a high-K dielectric material, or may be formed as a stack of two or more materials where preferably at least one material is a high-K material in order to form a blocking layer. Floating gate layer F1 may be formed of doped polysilicon or other suitable conductive material, for example a metal or metal silicide. Mask layer H1 may be formed of a hard mask material such as Silicon nitride. Mask layer H1 is patterned by depositing a photoresist layer over mask layer H1 and transferring the pattern from the photoresist layer to mask layer H1 (e.g. by etching) to leave portions H1 as shown. Resist slimming may be performed on such a photoresist layer so that a portion of photoresist is initially patterned to have a dimension equal to the minimum feature size (F) of the lithographic process used, such a portion is then subject to slimming so that the dimension is reduced to less than F. The slimming process causes gaps between such portions to become correspondingly wider. Thus, gaps that are initially formed with a dimension equal to F are widened to be wider than F as shown in FIG. 5. Resist slimming may be achieved by subjecting a patterned resist layer to a suitable etching step. The pattern thus formed in the mask layer is used to pattern the underlying layers (floating gate layer F1 and dielectric layer D1) using anisotropic etching such as Reactive Ion Etching (RIE) or Reactive Ion Beam Etching (RIBE). This leaves portions F1 and D1 as shown. It should be noted that the dimensions of features shown in the Figures are not intended to accurately represent the dimensions of an actual device unless otherwise specified.

Figure 6:
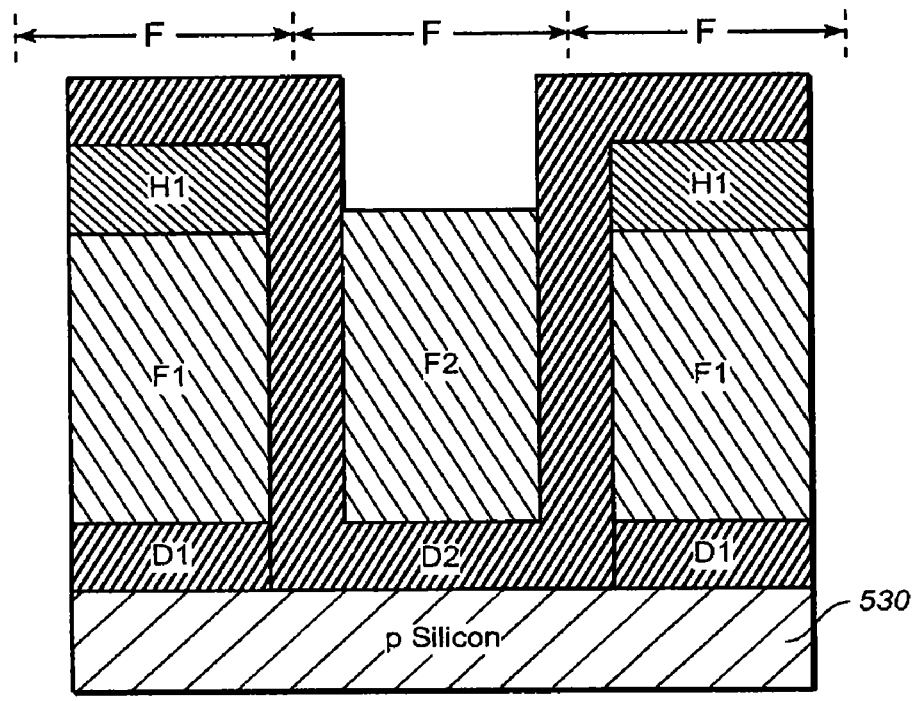
FIG. 6 shows the structure of FIG. 5 after deposition of a second dielectric layer and subsequent deposition and etch back of a second floating gate layer

Subsequently, a second dielectric layer D2 is deposited over the exposed surfaces of the structure of FIG. 5. Second dielectric layer D2 may be formed of the same material or materials and with the same thickness as dielectric layer D1, or may be formed of different material or materials and with a different thickness. In the example shown, dielectric layer D2 is formed of the same high-K material or materials and having the same thickness as dielectric layer D1. Thus, dielectric layer D2 also forms a blocking layer. Dielectric layer D2 is deposited so that it overlies exposed areas of the substrate and of hard mask portions H1 and also overlies sides of floating gate layer portions F1. Subsequent to depositing second dielectric layer D2, a second floating gate layer is formed over dielectric layer D2 and is etched back to form a second floating gate portion F2 as shown in FIG. 6. Second floating gate portion F2 may be etched back to have a top surface that is at approximately the same level as the top surfaces of first floating gate portions F1, or at some other level. The second floating gate portion F2 may be formed of the same material as used for first floating gate portions F1 or may be formed of a different material. In the present example, second floating gate portion F2 is formed of the same material as first floating gate portions F1. Also, second floating gate portion F2 that remains after etching back has a lateral dimension that is approximately the same as the lateral dimensions as first floating gate portions F1 (somewhat less than minimum feature size F).

Subsequently, first sidewall spacers H3 are formed over floating gate portion F2. First sidewall spacers H3 may be formed by depositing a film of suitable material over the structure of FIG. 6 and then etching back the film anisotropically so that only sidewall spacers H3 remain. Subsequent to forming first sidewall spacers H3, another mask layer is deposited across the structure and then planarization is performed to form the planarized structure of FIG. 7. In the present example, planarization is achieved by Chemical Mechanical Polishing (CMP). Thus, the mask layer is planarized to leave mask portion H4 overlying second floating gate portion F2. Mask portion H4 is centered over second floating gate portion F2 and may be considered self-aligned to the underlying second floating gate portion F2.

Figure 8:
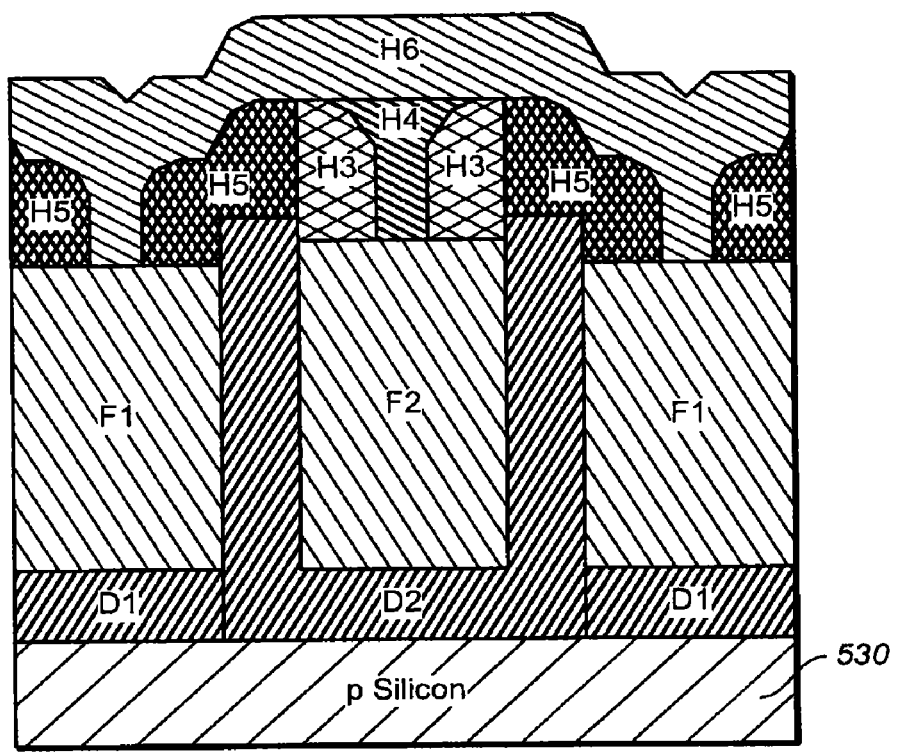
FIG. 8 shows the structure of FIG. 7 after etch back of the second dielectric layer, formation of second sidewall spacers and deposition of a hard mask material to fill gaps between second sidewall spacers.

Subsequently, a selective etch step is performed to remove portions of second dielectric layer D2 down to a level about half way between the top and bottom surfaces of hard mask layer portions H1. Then, remaining portions of hard mask layer H1 are removed and another layer is deposited and anisotropically etched back to form second sidewall spacers H5 extending from first sidewall spacers H3 over first floating gate portions F1. Second sidewall spacers H5 extend over first floating gate portions F1. Openings between second sidewall spacers H5 are centered over first floating gate portions F1 and may be considered to be self-aligned with first floating gate portions F1. Subsequently, another hard mask layer H6 is deposited to fill these openings and overlie second sidewall spacers H5 as shown in FIG. 8. In the present example, hard mask layer H6 is formed of the same material as hard mask layer H4 (e.g. Silicon Nitride).

Figure 9:
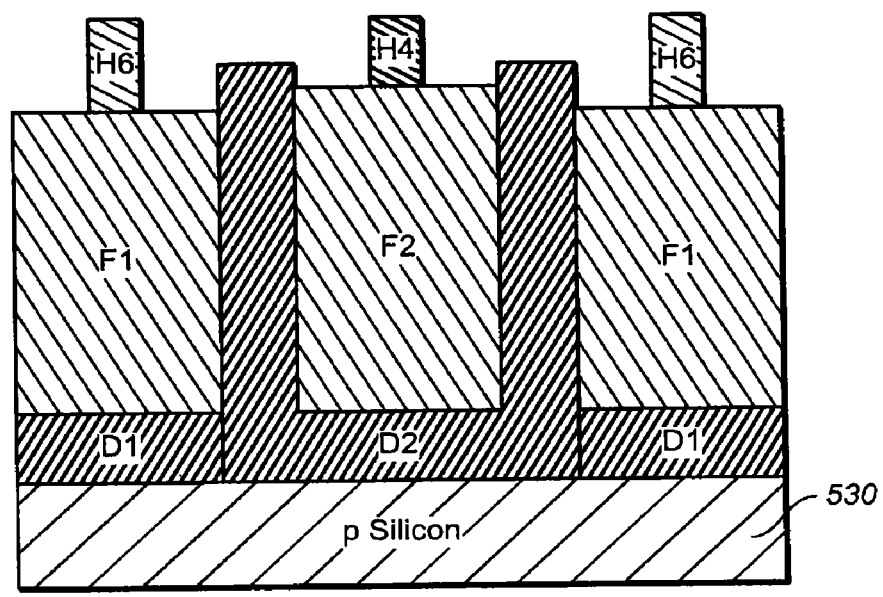
FIG. 9 shows the structure of FIG. 8 after planarization and selective etching to leave hard mask portions over remaining portions of first and second floating gate layers.

Subsequent to depositing mask layer H6, the structure of FIG. 8 is planarized (e.g. by CMP). Then a selective etch is performed to remove first sidewall spacers H3 and second sidewall spacers H5, leaving portions of hard mask portions H4 and H6 as shown in FIG. 9. Remaining hard mask portions H6 may be considered to be self-aligned to underlying first floating gate portions F1 because they were formed in openings that were self-aligned with first floating gate portions F1. Thus, at this point, both first and second floating gate portions F1, F2 have overlying hard mask portions H6, H4 that are centered on their top surfaces.

Figure 10:
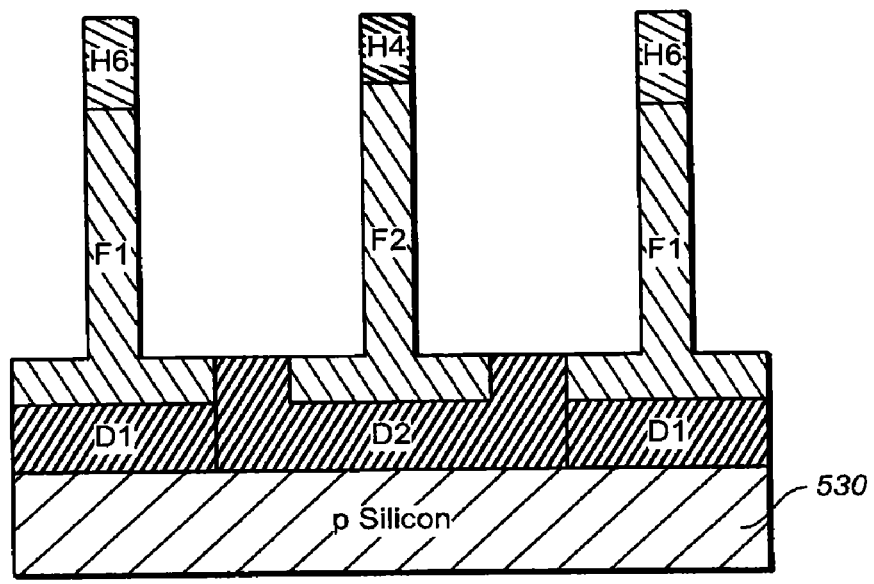
FIG. 10 shows the structure of FIG. 9 after anisotropic etching to produce floating gate portions having an inverted-T shape in cross section.

Subsequently, anisotropic etching is performed with hard mask portions H4 and H6 remaining in place so that floating gate portions F1 and F2 are etched away at their sides but are protected at the center. Etching is stopped before reaching the bottom surface of floating gate portions F1, F2, thus giving floating gate portions F1, F2 an inverted-T shape in cross section as shown in FIG. 10. Second dielectric layer D2 is also etched down to the same level in this etch step.

Figure 11:
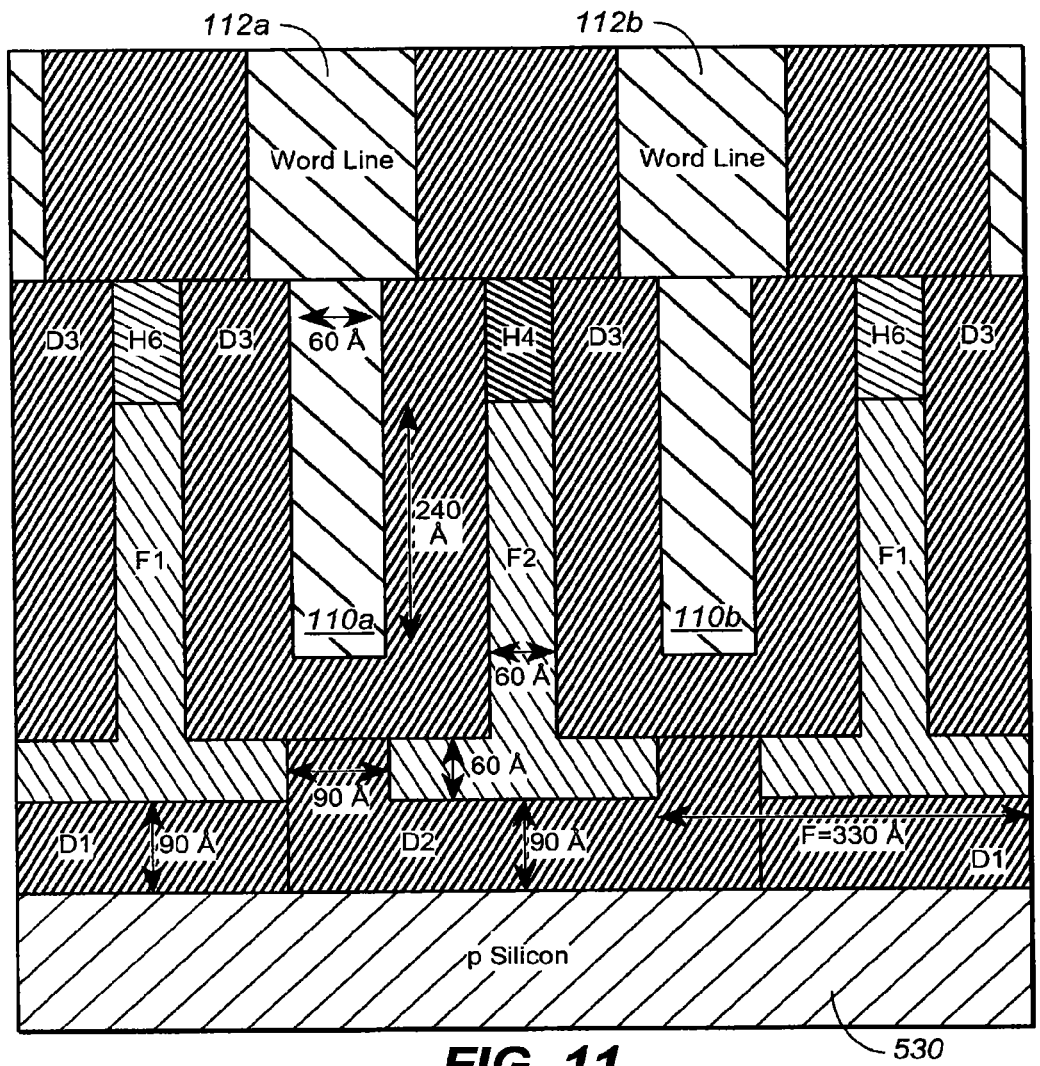
FIG. 11 shows the structure of FIG. 10 after formation of control gate portions and subsequent formation of STI structures that separate individual floating gates and control gates followed by formation of word lines to connect control gates of different strings.

Subsequently, a third dielectric layer D3 is formed over the structure of FIG. 10 and a conductive layer is formed over the third dielectric layer D3. In the present example, third dielectric layer D3 is a tunnel dielectric such as Silicon dioxide or Silicon Oxynitride to facilitate electron tunneling between control gates and floating gates. In other examples, a different dielectric may be used such as an ONO stack or high-K dielectric. Planarization is performed to form separate control gates 110a, 110b from the conductive layer as shown in FIG. 11. Floating gate portions F1, F2 may be separated into individual floating gates by forming Shallow Trench Isolation (STI) structures at this point. Such STI structures provide isolation between adjacent NAND strings in the word line direction (the direction perpendicular to the cross section shown). However, etching to form STI structures at this point divides control gates 110a, 110b. Word lines 112a, 112b are subsequently added to connect control gates in the word line direction as shown in FIG. 11. Word lines may be formed by depositing a layer of conductive material and then patterning the material. Resist slimming may be used to form word lines that are narrower or wider than F. For example, wider word lines may be desirable to reduce resistance and provide additional coupling to floating gates. The pattern used to form word lines 112a, 112b in this example is not self-aligned to control gates 110a, 110b so a separate alignment step is required. However, the design is relatively insensitive to misalignment because word lines do not have to be exactly centered over control gates in order to make good electrical contact. The area of contact between a word line and a control gate (and hence the resistance of the interface) is unaffected by a small amount of misalignment. Word lines extend over STI structures to link control gates of different NAND strings along the word line direction.

FIG. 11 shows some exemplary dimensions. In particular, the structure of FIG. 11 is formed using a lithographic process that has a minimum feature size F of 330 Angstroms (330 {acute over (.ANG.)}). As is shown, a floating gate and the dielectric layer between floating gates between them extend for 330 Angstroms along the direction of the NAND string (bit line direction). Thus, the memory array shown has a high density of cells per unit area. The gap between floating gates at their closest point is only 90 Angstroms (90 {acute over (.ANG.)}) in this example so that floating gates (extending approximately 240 Angstroms) overlie most of the channel and thus reduce direct coupling between control gates and the substrate.

In an alternative embodiment, STI structures are formed earlier in the process flow and control gates are formed extending over STI structures. In such a design, it may be unnecessary to form additional word lines over control gates because control gates remain connected together to form word lines. However, word lines may be added in this case also to provide lower resistance.

While the structure of FIG. 11 has first floating gates F1 and second floating gate F2 of substantially the same dimensions and formed of the same material, the formation of floating gates from two layers allows alternate cells along a NAND string to have different physical properties. Odd numbered cells (e.g. cells with floating gates FG1, FG3 of FIG. 1) may have one set of properties, while even numbered cells (e.g. cells with floating gates FG0, FG2 of FIG. 1) may have a different properties. For example, second floating gate layer FG2 may be formed of a different material to first floating gate layer FG1. Second dielectric layer D2 may also be formed of a different material to first dielectric layer D1. Physical dimensions of floating gates and dielectric layers formed in this way may differ. One set of floating gates may have a gate dielectric of a certain thickness, while the other set off floating gates may have a gate dielectric of a different thickness. One set of floating gates may have a certain coupling ratio to the underlying channel, while the other set of floating gates may have a different coupling ratio to the underlying channel. One set of floating gates cells may have a particular threshold voltage, while the other set of floating gates have a different threshold voltage. Thus, the characteristics of alternate floating gates may be different. Word line driver circuits may be arranged to use different voltages to access such cells.

Figure 7:
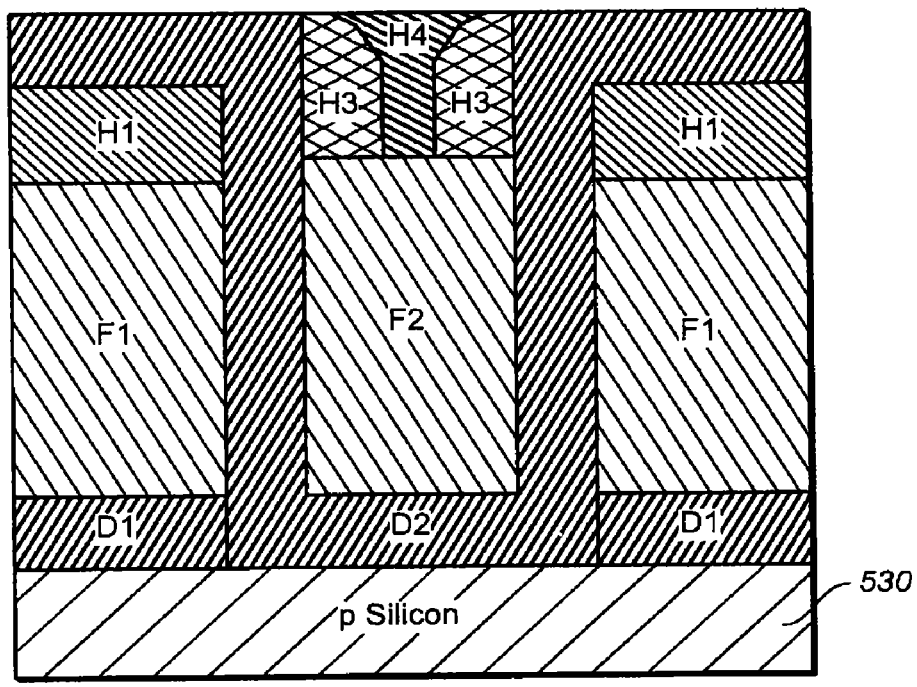
FIG. 7 shows the structure of FIG. 6 after formation of sidewall spacers and deposition and planarization to fill a gap between sidewall spacers with a hard mask material.

In an alternative process, hard mask portions used to form inverted-T shaped floating gates are formed using separate patterning steps, including alignment of a hard mask pattern to the floating gate portions. Thus, instead of forming sidewall spacers of hard mask layers H3 and H5 to provide self-aligned hard mask portions of hard mask layers H4 and H6 as shown in FIGS. 7 and 8, a structure like that of FIG. 9 may be formed from the structure of FIG. 6 by planarization (e.g. CMP) and subsequent deposition and patterning of a hard mask layer. Patterning of the hard mask layer may include resist slimming to provide narrow hard mask portions or may use sidewall spacers to provide such narrow hard mask portions, for example according to a method described in U.S. Pat. No. 6,888,755.

In another embodiment, a NAND array is formed with control gates between floating gates of different layers, but with floating gates having a rectangular shape (not inverted-T shape) in cross section. For example, the process of FIGS. 5-11 may be modified to produce rectangular shaped floating gates by etching further when shaping floating gates between FIG. 9 and FIG. 10 so that the floating gates are etched through to the underlying dielectric layer on either side. Dimensions may be adjusted in such a process so that remaining floating gates are sufficiently wide to provide adequate coupling to the channel.

The processes described for producing side-tunneling structures may be modified for bottom-tunneling by exchanging the dielectric layer used between floating gates and control gates with the dielectric layer used between floating gates and the channel. In such a structure, a tunnel dielectric lies below the channel and the floating gate, while the dielectric layers between the floating gate and control gates are not necessarily tunnel dielectrics. In this way, a dual-layer process may be used to provide a bottom-tunneling structure. Thus, a dual-layer floating gate process may be used to produce a side-tunneling, top-tunneling or bottom tunneling floating gate memory cell array.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain preferred embodiments, it is understood that the invention is entitled to protection within the full scope of the appended claims.

The invention claimed is:

1. A method of programming a NAND flash memory array comprising:
applying a first voltage to a first control gate adjacent to a floating gate on a first side; applying a second voltage to a second control gate adjacent to the floating gate on a second side; and
applying a third voltage to a channel region under the floating gate, wherein the first voltage, the second voltage and the third voltage couple to the floating gate to generate a voltage difference between the first control gate and the floating gate that is sufficient to produce electron tunneling between the first control gate and the floating gate.

2. The method of claim 1, wherein no electron tunneling is produced between the channel region and the floating gate.

3. The method of claim 1, wherein electrons tunnel from the floating gate to the first control gate removing negative charge from the floating gate to program the floating gate.

4. The method of claim 1, wherein the floating gate has an inverted-T shape in cross section.

5. The method of claim 1, further comprising subsequently modifying the third voltage, without modifying the first and second voltages, to change the voltage difference between the first control gate and the floating gate such that electron tunneling between the first control gate and the floating gate ceases.

* * * * *